United States Patent
Kang et al.

(10) Patent No.: US 12,408,370 B2
(45) Date of Patent: Sep. 2, 2025

(54) STRUCTURE AND FABRICATION METHOD OF HIGH VOLTAGE MOSFET WITH A VERTICAL DRIFT REGION

(71) Applicant: Applied Materials, Inc., Santa Clara, CA (US)

(72) Inventors: Changseok Kang, San Jose, CA (US); Tomohiko Kitajima, San Jose, CA (US); Gill Yong Lee, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 507 days.

(21) Appl. No.: 17/714,093

(22) Filed: Apr. 5, 2022

(65) Prior Publication Data
US 2023/0317845 A1   Oct. 5, 2023

(51) Int. Cl.
*H10D 30/00* (2025.01)
*H10D 30/01* (2025.01)
*H10D 30/65* (2025.01)
*H10D 62/17* (2025.01)

(52) U.S. Cl.
CPC ......... *H10D 30/65* (2025.01); *H10D 30/0281* (2025.01); *H10D 62/393* (2025.01)

(58) Field of Classification Search
CPC ............. H01L 29/7816; H01L 29/1095; H01L 29/66681; H01L 29/41775; H01L 29/66575; H01L 29/66628; H01L 29/7833; H01L 29/0852; H01L 29/0692; H01L 29/66477; H10B 41/40; H10B 43/40; H10D 30/65; H10D 30/0281; H10D 62/393; H10D 30/608; H10D 30/0223; H10D 64/258; H10D 30/0275; H10D 62/151; H10D 62/152; H10D 30/021; H10D 62/126
USPC .......................................................... 257/393
See application file for complete search history.

(56) References Cited

U.S. PATENT DOCUMENTS

| | | | |
|---|---|---|---|
| 6,781,194 B2 * | 8/2004 | Baliga .................... | H10D 30/66 257/E29.066 |
| 6,800,904 B2 * | 10/2004 | Fujishima .......... | H10D 84/0195 257/341 |
| 6,858,500 B2 * | 2/2005 | Sugi ...................... | H10D 62/83 257/E29.267 |

(Continued)

OTHER PUBLICATIONS

Jone F. Chen, et al., "Characteristics and Reliability of Metal-oxide-semiconductor Transistors with Various Depths of Plasma-induced Si Recess Structure", Japanese Journal of Applied Physics 57 04FD01 (2018), 5 pages.

(Continued)

*Primary Examiner* — Sheikh Maruf
(74) *Attorney, Agent, or Firm* — Patterson + Sheridan, LLP

(57) ABSTRACT

Embodiments of the present disclosure include a transistor with a vertical drift region and methods for forming the transistor. The transistor may include a well region of a first conductivity type, a gate region disposed above the well region, and a drift region of a second conductivity type, different from the first conductivity type. The drift region may have a lateral portion disposed above a portion of the well region and laterally adjacent to a semiconductor channel in the well region. The drift region may also have a vertical portion extending vertically from the lateral portion of the drift region.

10 Claims, 10 Drawing Sheets

(56) References Cited

U.S. PATENT DOCUMENTS

| | | | | |
|---|---|---|---|---|
| 2005/0062101 | A1* | 3/2005 | Sugi | H10D 86/01 |
| | | | | 257/E29.136 |
| 2009/0256212 | A1* | 10/2009 | Denison | H10D 64/117 |
| | | | | 257/408 |
| 2010/0006931 | A1* | 1/2010 | Denison | H10D 30/668 |
| | | | | 257/334 |
| 2010/0025756 | A1* | 2/2010 | Fu | H10D 30/0281 |
| | | | | 438/290 |
| 2013/0161740 | A1* | 6/2013 | Disney | H10D 64/115 |
| | | | | 438/286 |
| 2014/0151798 | A1* | 6/2014 | Meiser | H10D 30/658 |
| | | | | 438/286 |
| 2015/0123199 | A1* | 5/2015 | Chen | H10D 64/111 |
| | | | | 438/286 |
| 2015/0270389 | A1* | 9/2015 | Iravani | H01L 21/76202 |
| | | | | 438/286 |
| 2015/0325693 | A1* | 11/2015 | Mori | H10D 64/118 |
| | | | | 257/339 |
| 2016/0240662 | A1* | 8/2016 | Park | H10D 30/603 |
| 2017/0062415 | A1* | 3/2017 | Mallikarjunaswamy | |
| | | | | H10D 62/393 |
| 2017/0194489 | A1* | 7/2017 | Park | H01L 29/407 |
| 2019/0081146 | A1* | 3/2019 | Iwatsu | H10D 30/65 |
| 2020/0273990 | A1* | 8/2020 | Ishii | H01L 29/0865 |
| 2021/0134998 | A1* | 5/2021 | Sundaresan | H01L 29/0865 |
| 2021/0398901 | A1* | 12/2021 | Zhou | H01L 23/5226 |
| 2022/0052158 | A1* | 2/2022 | Gu | H01L 29/7816 |
| 2022/0123005 | A1* | 4/2022 | Lee | H10B 41/40 |
| 2022/0238544 | A1* | 7/2022 | Jung | G11C 16/12 |
| 2022/0262790 | A1* | 8/2022 | Kim | H01L 27/088 |
| 2022/0293180 | A1* | 9/2022 | Lee | G11C 11/5628 |
| 2022/0307343 | A1* | 9/2022 | Hearn | H01L 25/50 |
| 2022/0367505 | A1* | 11/2022 | Chen | H01L 24/08 |
| 2023/0247839 | A1* | 8/2023 | Lin | H10B 51/00 |
| | | | | 257/295 |
| 2023/0363157 | A1* | 11/2023 | Kim | H10B 43/20 |

OTHER PUBLICATIONS

Li, Juanjuan, et al., "High Performance HVNMOS Development for Advanced Planner NAND Flash", Shanghai Huali Microelectronics Corpoartion (HLMC), Shanghai 201203, China (3 pages).

* cited by examiner

STRUCTURE AND FABRICATION METHOD OF HIGH VOLTAGE MOSFET WITH A VERTICAL DRIFT REGION

BACKGROUND

Field

Embodiments of the present disclosure generally relate to semiconductor fabrication, and more particularly, to systems and methods of forming high voltage metal-oxide-semiconductor field-effect transistors (MOSFETs).

Description of the Related Art

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals.

The MOSFET is by far the most common transistor in digital circuits, as hundreds of thousands or millions of MOSFETs may be included in a memory chip or microprocessor. Since MOSFETs can be made with either p-type or n-type semiconductors, complementary pairs of MOS transistors can be used to make switching circuits with very low power consumption, in the form of complementary metal-oxide-semiconductor (CMOS) logic.

High voltage transistors (e.g., with off-state breakdown voltages (VBD) of 5-30 V) are widely used in a variety of applications, including in NAND flash memory periphery circuits. A NAND flash memory chip may be composed of a cell array and peripheral circuits including X-decoder, Y-decoder, and other circuits. To reduce the size of the cell array for a given memory density, the cell array may have a 3-dimensional structure (e.g., 3D NAND). For each generation of 3D NAND flash memory, the number of memory stacks has been increased. However, the scaling-down of peripheral circuits has been much slower than the increase of memory density. More than half of the area of the peripheral circuits may be occupied by the high voltage transistor region. However, reducing the dimensions of high voltage transistors while maintaining a high VBD has proved challenging.

Thus, there is a need for high voltage transistors that occupy reduced area while maintaining a high VBD, and methods of producing such transistors.

SUMMARY

The present disclosure generally relates to structure and fabrication methods of a high voltage MOSFET with a drift region having a vertical portion.

Embodiments of the present disclosure provide a transistor comprising a well region of a first conductivity type, a gate region disposed above the well region, and a drift region of a second conductivity type, different from the first conductivity type, the drift region comprising a lateral portion disposed above a portion of the well region and laterally adjacent to a semiconductor channel in the well region, and a vertical portion extending vertically from the lateral portion of the drift region. The transistor may further comprise a drain region or a source region of the second conductivity type. In some embodiments, the vertical portion of the drift region has a first length that extends in a first direction between a surface of the lateral portion and the drain region or extends in a first direction between a surface of the lateral portion and the source region, the lateral portion of the drift region has a second length that extends in a second direction between an edge of the semiconductor channel and an edge of the vertical portion of the drift region, and the sum of the first length and the second length are configured to achieve a breakdown voltage of the transistor of at least 30 V.

Embodiments of the present disclosure provide a method of forming a transistor, the method comprising forming a well region of a first conductivity type, forming a gate region disposed above the well region, and forming a drift region of a second conductivity type, different from the first conductivity type. According to certain embodiments, forming the drift region comprises forming a lateral portion disposed above a portion of the well region and laterally adjacent to a semiconductor channel in the well region, and forming a vertical portion extending vertically from the lateral portion of the drift region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, details are set forth by way of example to facilitate an understanding of the disclosed subject matter. It should be apparent to a person of ordinary skill in the field, however, that the disclosed implementations are exemplary and not exhaustive of all possible implementations. Thus, it should be understood that reference to the described examples is not intended to limit the scope of the disclosure. Any alterations and further modifications to the described devices, instruments, methods, and any further application of the principles of the present disclosure are fully contemplated as would normally occur to one skilled in the art to which the disclosure relates. In particular, it is fully contemplated that the features, components, and/or steps described with respect to one implementation may be combined with the features, components, and/or steps described with respect to other implementations of the present disclosure. As used herein, the terms "about" and "approximately" may refer to a +/−10% variation from the nominal value. It is to be understood that such a variation can be included in any value provided herein.

The embodiments described herein provide systems and methods for forming high voltage transistors with drift regions having a vertical portion. The breakdown voltage (VBD) of a transistor is directly proportional to the length of the drift region of the transistor. Accordingly, reducing the dimensions of the transistor by reducing the length of the drift region reduces the VBD. However, by forming part of the drift region vertically, the overall lateral area (e.g., the "footprint") of the transistor may be reduced without reducing the length of the drift region. Accordingly, the lateral area of the transistor may be reduced without reducing the VBD of the transistor.

Figure 1A:
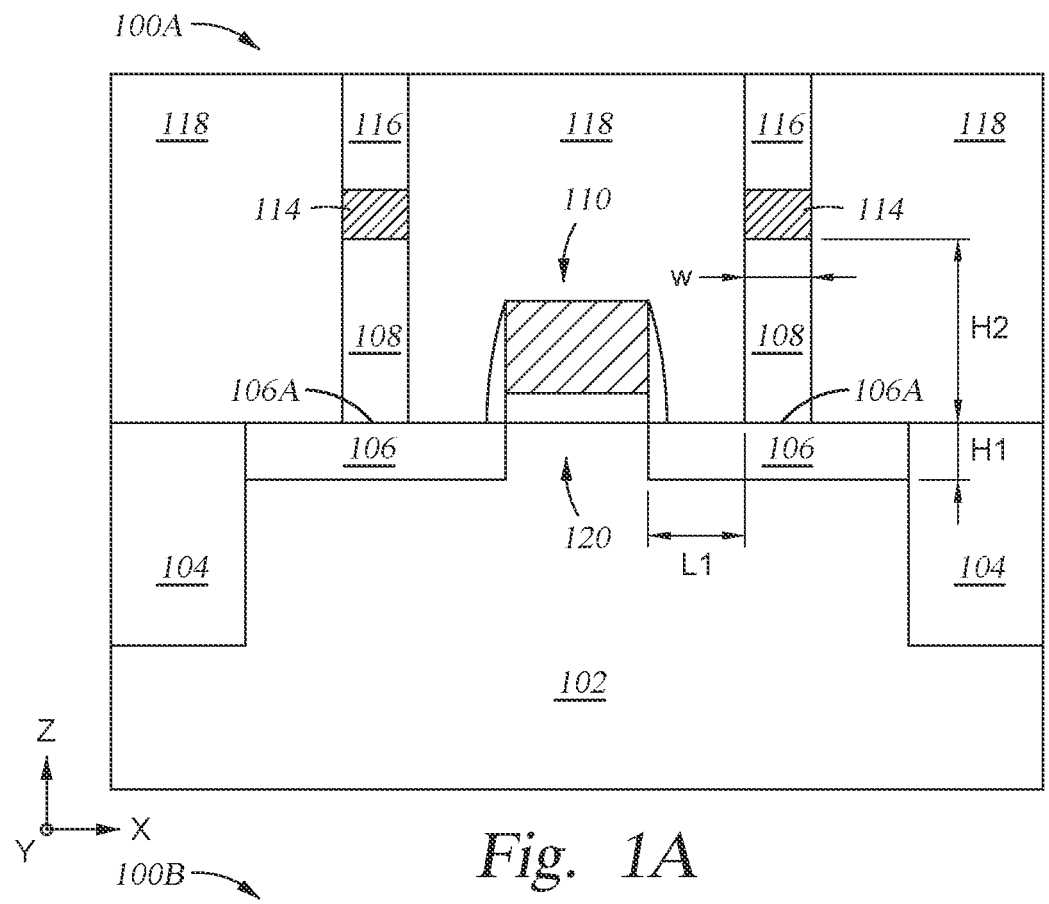
FIG. 1A is a cross-sectional view of an example n-type transistor with a drift region having a vertical portion, according to one or more of the embodiments described herein.

FIG. 1A is a cross-sectional view of an example n-type transistor 100A with drift regions having a vertical portion, according to one or more of the embodiments described herein.

The transistor 100A may include a p-type well region 102 with an active region defined by isolation regions 104. The transistor 100A may also include drift regions defined in the active region. The drift regions may include lightly doped n-type regions (e.g., n− regions), including lateral portions 106 and vertical portions 108. As shown, the lateral portions 106 of the drift regions may be laterally adjacent to a semiconductor channel 120 in the well region 102. The lateral portions 106 of the drift regions may have a height ($H_1$), which represents the depth to which the n-type dopants were implanted in the well region 102. The height $H_1$ may have a value between 0.1 μm to 0.3 μm. The vertical portions 108 of the drift regions may have a width (w) and a height ($H_2$). In some examples, the width w may be approximately equal to the height $H_1$. In some examples, the height $H_2$ may have a value between 0.1 μm and 0.6 μm. Although each of the vertical portions 108 as illustrated is disposed in the middle of a lateral portion 106, a vertical portion 108 may be disposed at a position offset from the middle of a lateral portion 106 or a vertical portion 108 may be disposed at one end of a lateral portion 106. To avoid confusion relating a definition of a total length of the drift region, the vertical portion, which accounts for a portion of the total length of the drift region, is also referred to as having a "length." The "length" of the vertical portion 108, 126 is generally defined as being equal to the height $H_2$, which extends between the source/drain 114, 128 and a surface 106A, 124A of the lateral region 106, 124.

According to certain embodiments, the vertical portions 108 of the drift regions may have a graded doping profile, in which the doping concentration increases as a distance from the well region 102 increases (e.g., as the location in the Z-direction increases). In certain embodiments, the graded doping profile may be graded from a first doping concentration (C1) to a second doping concentration (C2). In certain embodiments, C2 may be 1.1 to 100 times greater than C1. For example, C1 may be about $5 \times 10^{17}$ atoms per cubic centimeter (atoms/cm$^3$) and C2 may be about $2 \times 10^{19}$ atoms/cm$^3$. The graded doping profile serves to further increase the breakdown voltage of the transistor 100A.

The transistor 100A may include source/drain regions 114 disposed above the vertical portions 108 of the drift regions, and electrically conductive contacts 116 disposed above the source/drain regions 114. The source/drain regions 114 may be heavily doped n-type regions (e.g., n+ regions), as shown. The transistor 100A may include a gate structure 110, which may include a gate stack and spacers. The transistor 100A may also include an inter-layer dielectric (ILD) layer 118, which acts to provide electrical insulation.

The drift regions may serve as a resistive buffer between the source/drain regions 114 while the transistor 100A is in an OFF state. That is, the drift regions may prevent (or at least reduce) current flow (e.g., leakage) between the source/drain regions 114 when a voltage below a threshold voltage is applied to the transistor 100A. When a voltage at or above the threshold voltage is applied to the transistor 100A, the transistor 100A is in an ON state, and current may flow through the drift regions between the source/drain regions 114.

Figure 1B:
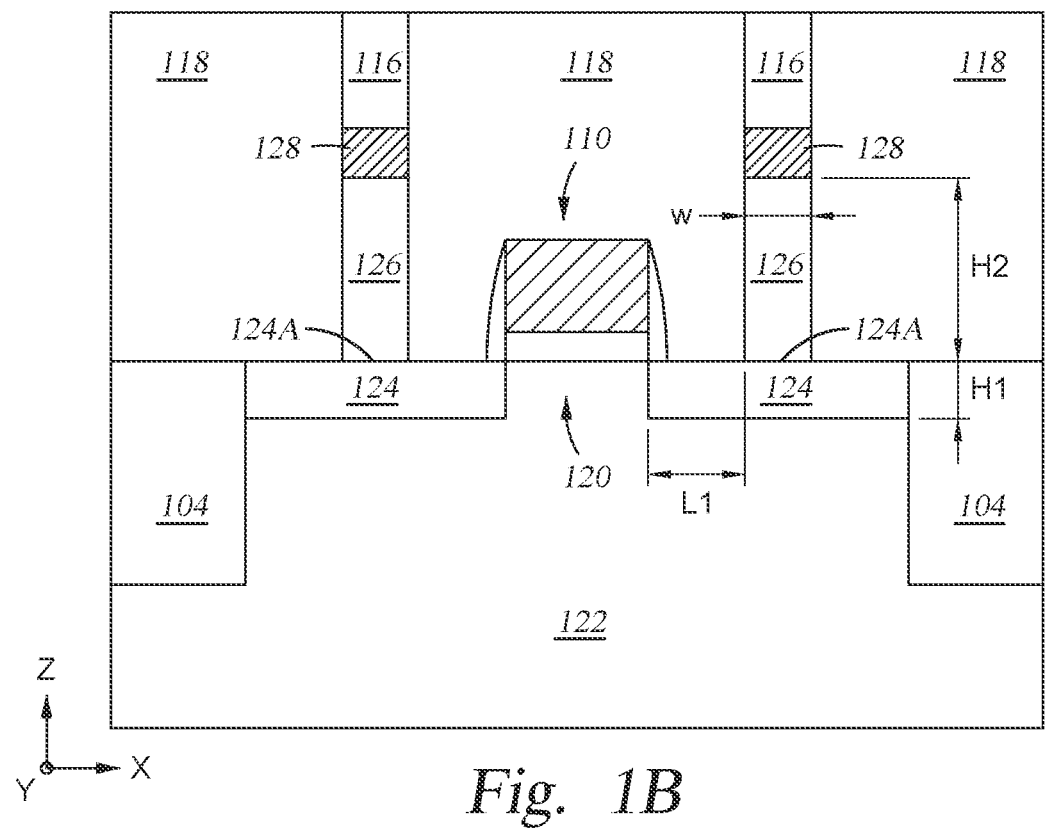
FIG. 1B is a cross-sectional view of an example p-type transistor with a drift region having a vertical portion, according to one or more of the embodiments described herein.

FIG. 1B is a cross-sectional view of an example p-type transistor 100B with drift regions having vertical portions 126, according to one or more of the embodiments described herein. The transistor 100B may be similar to the transistor 100A, but with certain structures having an opposite conductivity type from those described with respect to FIG. 1A. For example, the transistor 100B may include a substrate with an n-type well region 122 (as opposed to the p-type well region 102 in transistor 100A). The transistor 100B may also include drift regions comprising lightly doped p-type regions (e.g., p− regions), including lateral portions 124 and vertical portions 126. The transistor 100B may include source/drain regions 128 disposed above the vertical portions 126 of the drift regions. The source/drain regions 128 may be heavily doped p-type regions (e.g., p+ regions), as shown.

Transistors 100A and 100B may be considered high voltage transistors, and may have a breakdown voltage (VBD) of at least 30 V. In some embodiments, as shown in FIG. 1A, the vertical portion 108 of the drift region has a first length (e.g., height $H_2$) that extends in a first direction (i.e., Z-direction) between a surface 106A of the lateral portion 106 and a source/drain region 114, and the lateral portion 106 of the drift region has a second length ($L_1$) that extends in a second direction (e.g., X-direction) between an edge of the semiconductor channel 120 and an edge of the vertical portion 108 of the drift region. Similarly, in some embodiments, as shown in FIG. 1B, the vertical portion 126 of the drift region has a first length (e.g., height $H_2$) that extends in a first direction (i.e., Z-direction) between a surface 124A of the lateral portion 124 and a source/drain region 128, and the lateral portion 124 of the drift region has a second length ($L_1$) that extends in a second direction (e.g., X-direction) between an edge of the semiconductor channel 120 and an edge of the vertical portion 126 of the drift region. In some embodiments, the sum of the first length and the second length, or drift region length (i.e., DRL=$H_2$+$L_1$), and/or the doping levels in the vertical portion 108, 126 and lateral portion 106, 124, respectively, are adjusted to achieve a desired breakdown voltage (VBD), such as a VBD of at least 30 V.

FIGS. 2A-2M are cross-sectional views of intermediate structures at various stages of semiconductor processing to form a transistor (e.g., transistor 100A) according to one or more of the embodiments described herein. The transistor formed according to the method of FIGS. 2A-2M can form part of a larger device, such as a 3D NAND flash memory chip (discussed further with respect to FIG. 5). While the formation of a n-type transistor (e.g., an NMOS transistor such as the transistor 100A) is discussed with respect to FIGS. 2A-2M, persons having ordinary skill in the relevant art will appreciate that similar methods may be used to form a p-type transistor (e.g., a PMOS transistor such as the transistor 100B), in which the doped structures of the transistor have a conductivity type opposite those described below.

Figure 2A:
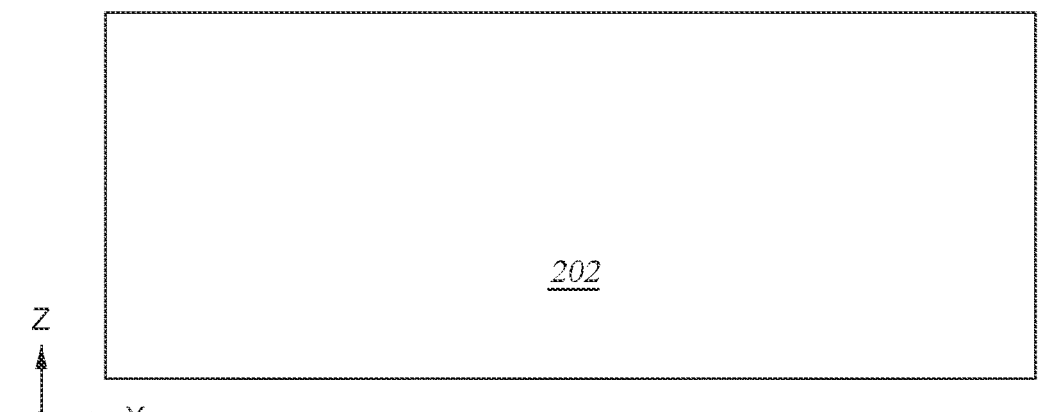
FIGS. 2A-2H and 2J-2M are cross-sectional views of intermediate structures at various stages of semiconductor processing to form a transistor structure, according to one or more of the embodiments described herein.

Referring to FIG. 2A, a well region 202 is formed by well implantation in a substrate. Alternatively, the well region 202 may be a substrate with a desired doping concentration. The dopants in the well region 202 may be p-type dopants. Accordingly, the well region 202 may be referred to as a p-well. In some examples, the p-well may have a boron (B) doping concentration ranging from approximately $1\times10^{11}$ to $1\times10^{13}$ atoms/cm³.

Figure 2B:
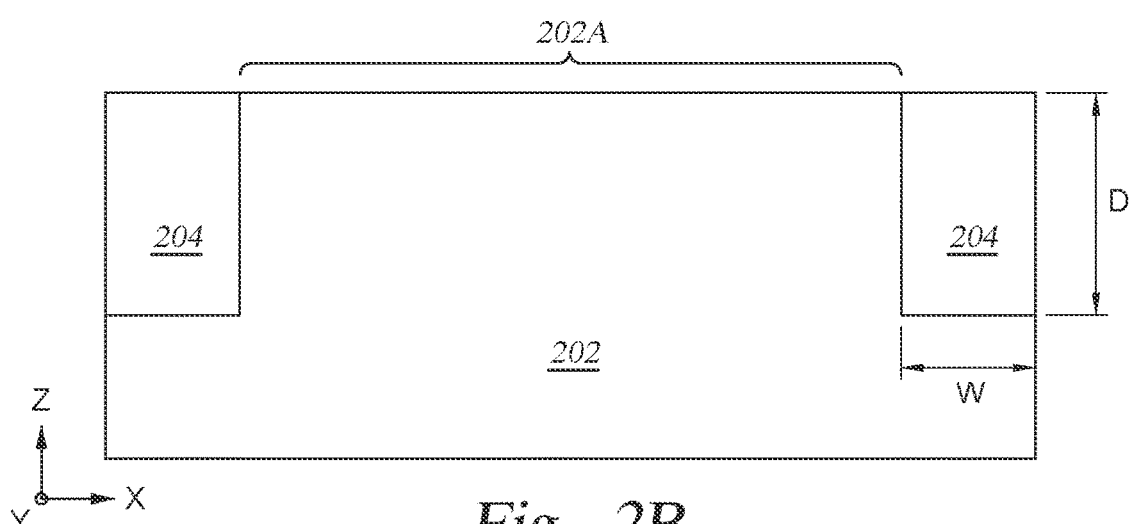

Referring to FIG. 2B, an active region 202A may be defined in a portion of the well region 202. The active area 202A can be an area defined between isolation regions 204, such as shallow trench isolations (STIs). In some examples, the depth (D) of the isolation regions 204 may range from approximately 0.02 µm to 2.0 µm in the Z-direction. In some examples, the width (W) of the isolation regions 204 may range from 0.05 µm to 5 µm.

Figure 2C:
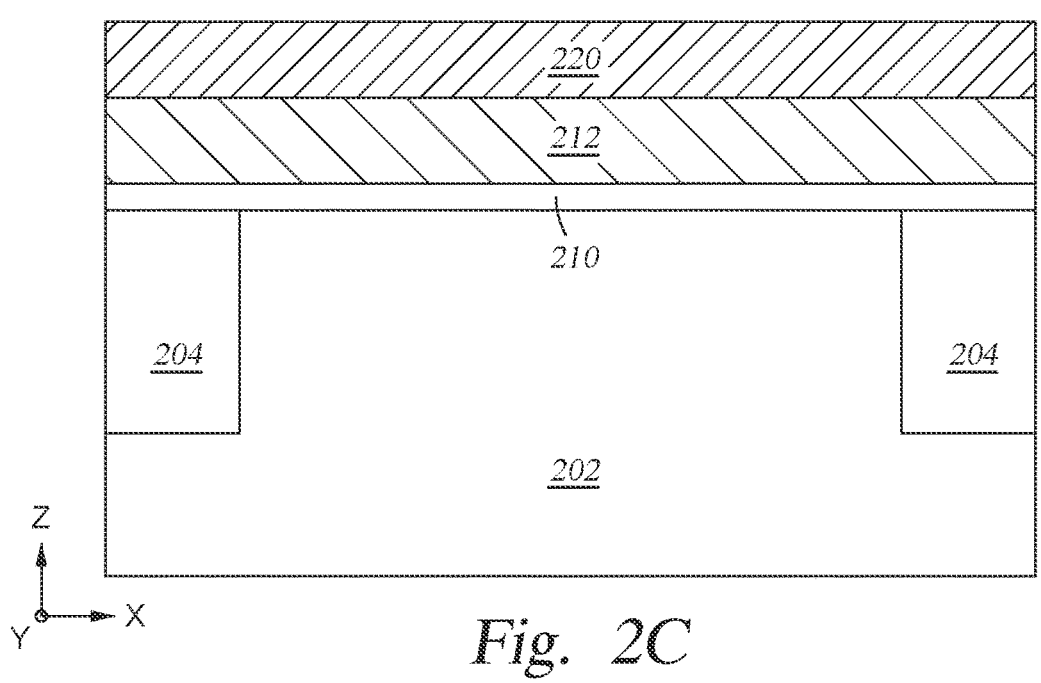

Referring to FIG. 2C, gate region layers may be formed on top of the well region 202 and isolation regions 204. The gate region layers may include a gate oxide layer 210, a gate layer 212, and a hard mask layer 220. In some examples, the gate oxide layer 210 may be formed from silicon dioxide (SiO$_2$), silicon-oxynitride (SiON), or the like, and may have a thickness of approximately 20 nm to 100 nm in the Z-direction. In some examples, the gate layer 212 may be formed from nitrogen and/or silicon, and may have a thickness of approximately 20 nm to 100 nm in the Z-direction. In some examples, the hard mask layer 220 may be a moderate-temperature oxide (MTO) hard mask, and may have a thickness of approximately 50 nm to 200 nm in the Z-direction.

Figure 2D:
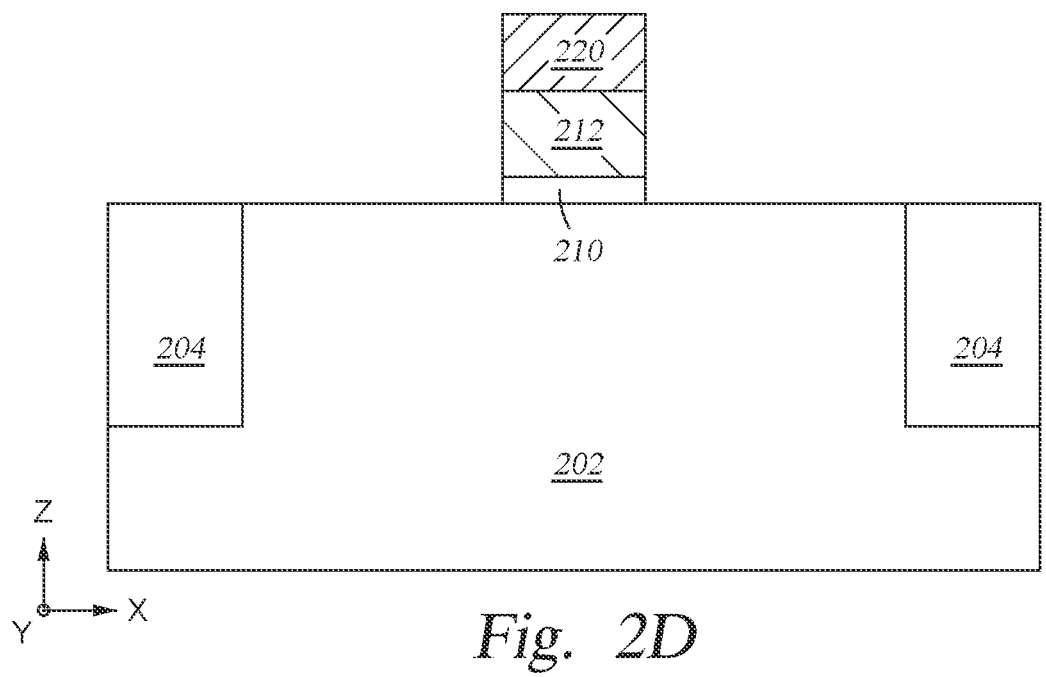

Referring to FIG. 2D, the gate region layers may be patterned to form the gate structure 230. For example, the gate structure 230 may be patterned using appropriate lithography and etching techniques (e.g., photolithography), which are known in the art.

Figure 2E:
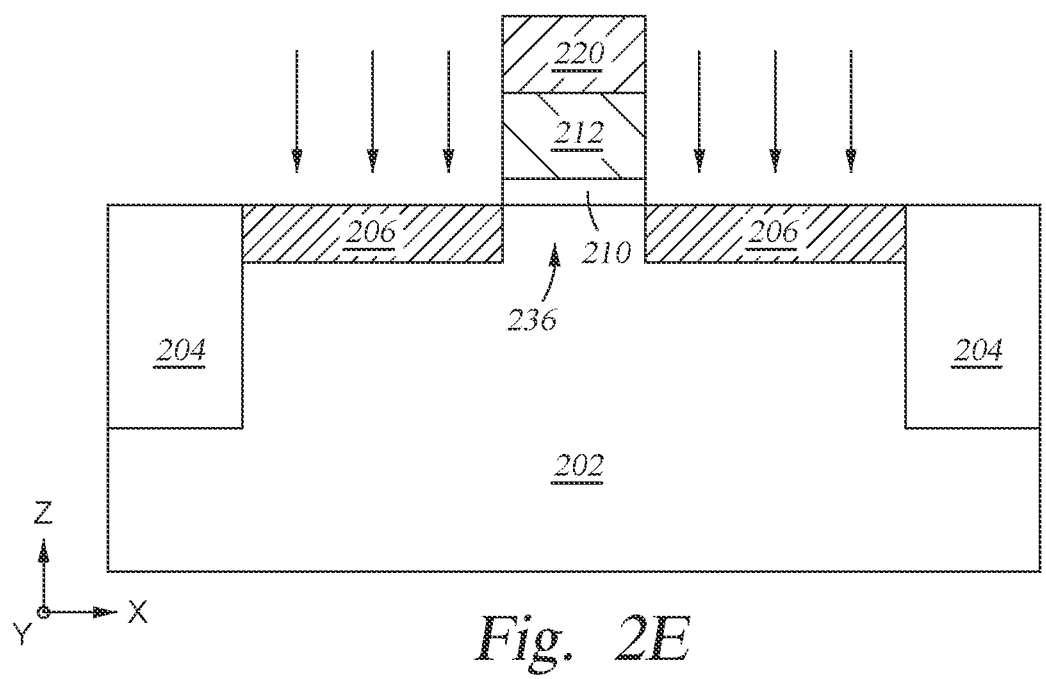

Referring to FIG. 2E, an n-type dopant may be implanted into the active region of the well region 202 on either side of the gate structure 230 to form lateral portions 206 of a drift regions. The implanted dopant may be phosphorous, arsenic, or the like. The projected range of the drift regions may be between 0.1 µm and 0.5 µm. The dopant concentration of the lateral portions 206 of the drift regions may range from $1\times10^{14}$ to $1\times10^{17}$ atoms/cm³. Accordingly, the lateral portions 206 of the drift regions may be considered a lightly doped n-type region (e.g., n− region). The lateral portions 206 of the drift regions may also define a semiconductor channel 236 under the gate structure 230.

Figure 2F:
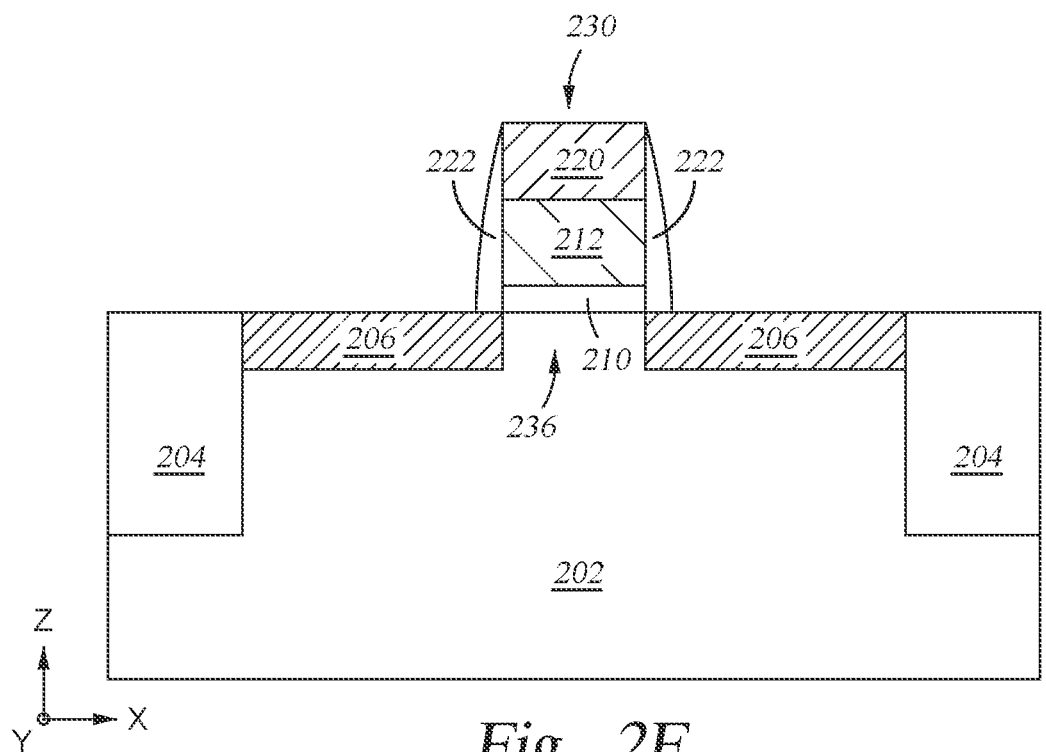

Referring to FIG. 2F, gate spacers 222 may be formed on each side of the gate structure 230. The gate spacers 222 may be formed using standard methods of spacer deposition and etch back, which are known in the art. For example, the gate spacers 222 can be formed by conformally depositing (such as by plasma enhanced chemical vapor deposition (PECVD), atomic layer deposition (ALD), or the like) one or more layers of silicon nitride, silicon oxide, silicon oxynitride, silicon carbon nitride, silicon oxycarbide, or the like, and anisoptropically etching (such as by a reactive ion etch (RIE)) the one or more layers. In some examples, the gate spacers 222 may have a thickness of approximately 0.1 um, as measured in the X-direction at the surface of the drift region.

Figure 2G:
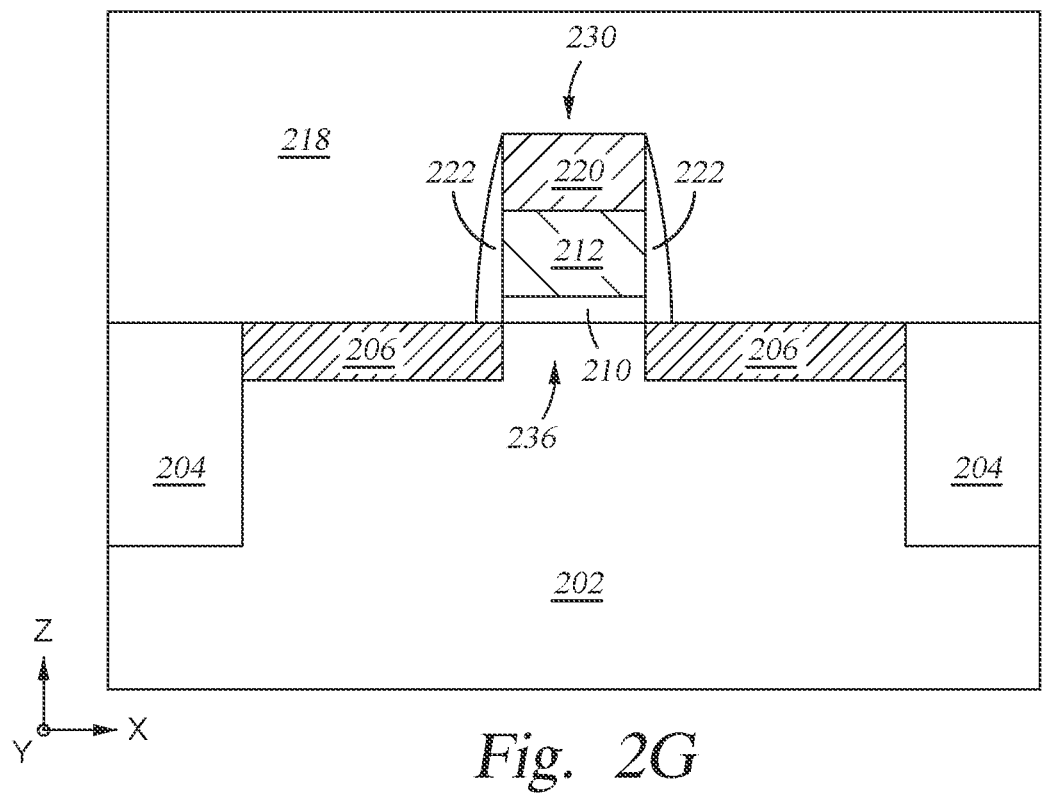

Referring to FIG. 2G, a first inter-layer dielectric (ILD) layer 218 may be formed above the substrate (e.g., well region 202) and the gate structure 230. The first ILD layer 218 may be any suitable dielectric material, such as silicon oxide, borophosphosilicate glass (BPSG), phosphosilicate glass (PSG), or the like. The first ILD layer 218 may be deposited by chemical vapor deposition (CVD), furnace chemical vapor deposition (FCVD), or another appropriate deposition process. After deposition, the first ILD layer 218 may planarized, such as by use of a chemical mechanical planarization (CMP) process. In some examples, the first ILD layer 218 may have a thickness of approximately 0.3 µm to 1.0 µm in the Z-direction.

Figure 2H:
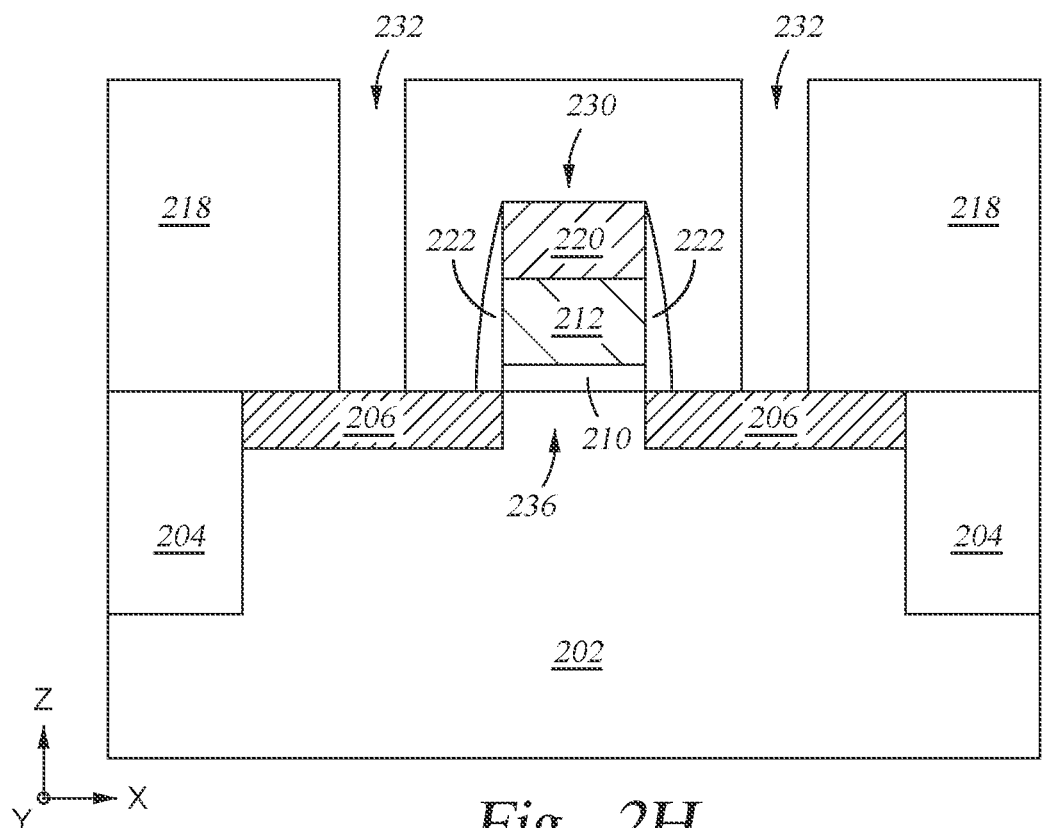

Referring to FIG. 2H, the first ILD layer 218 may be patterned and etched to form openings 232 through the first ILD layer 218 and stopping at the lateral portions 206 of the drift regions. In some examples, the openings 232 may be formed using a selectively opened mask layer (not shown).

Figure 2J:
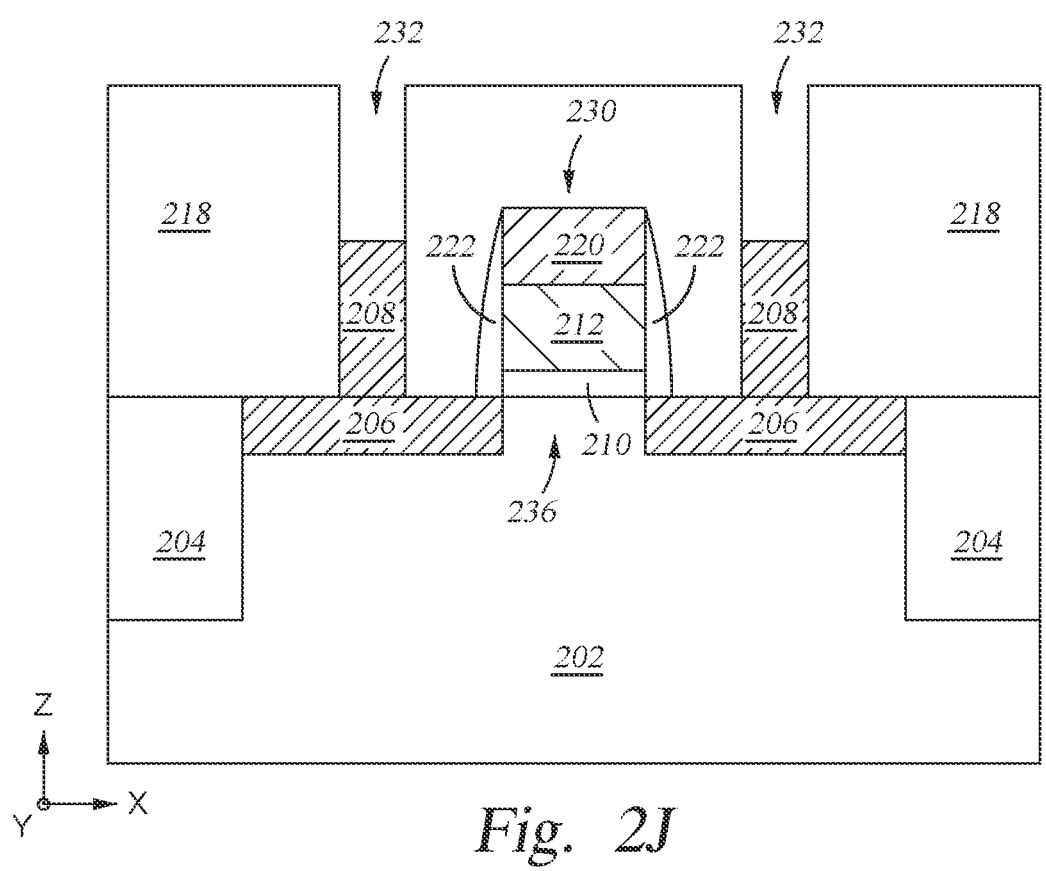

Referring to FIG. 2J, in some examples, silicon or another suitable crystal semiconductor may be selectively grown on the opening of the lateral portions 206 of the drift regions to form the vertical portions 208 of the drift regions. The selectively grown silicon material may be a doped silicon material that is formed during the deposition process. Alternatively, the selectively grown silicon may be un-doped silicon that is then implanted with dopants or doped using gas-phase doping methods. The dopant concentration of the vertical portions 208 of the drift regions may range from $1\times10^{14}$ to $1\times10^{20}$ atoms/cm³.

Figure 2K:
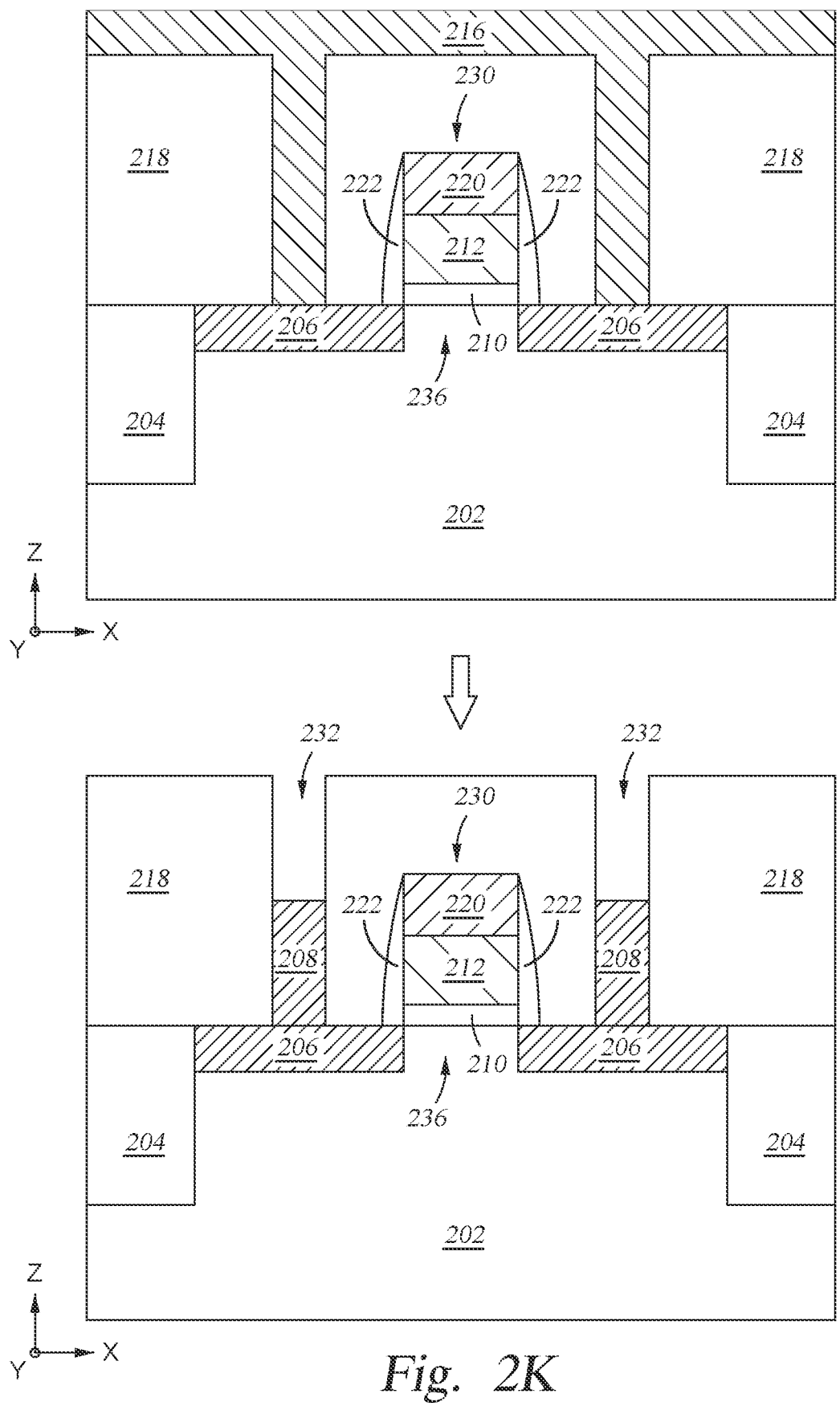

Alternatively, referring to FIG. 2K, in some examples, silicon or another suitable semiconductor may be deposited (e.g., epitaxially deposited) such that the silicon fills the openings 232 in the ILD layer 218 and forms a layer 216 over the ILD layer 218. The deposited silicon may then be etched back to form the vertical portions 208 of the drift regions, as shown. The deposited silicon may be doped silicon material that is formed during the deposition process. Alternatively, the deposited silicon may be un-doped silicon that is later implanted with dopants or doped using gas-phase doping methods.

As shown in both FIGS. 2J and 2K, a top of the vertical portions 208 of the drift regions may be above (e.g., at a height greater than) a top of the gate oxide layer 210. In some examples, the top of the vertical portions 208 of the drift regions may also be above a top of the gate layer 212, as shown.

Figure 2L:
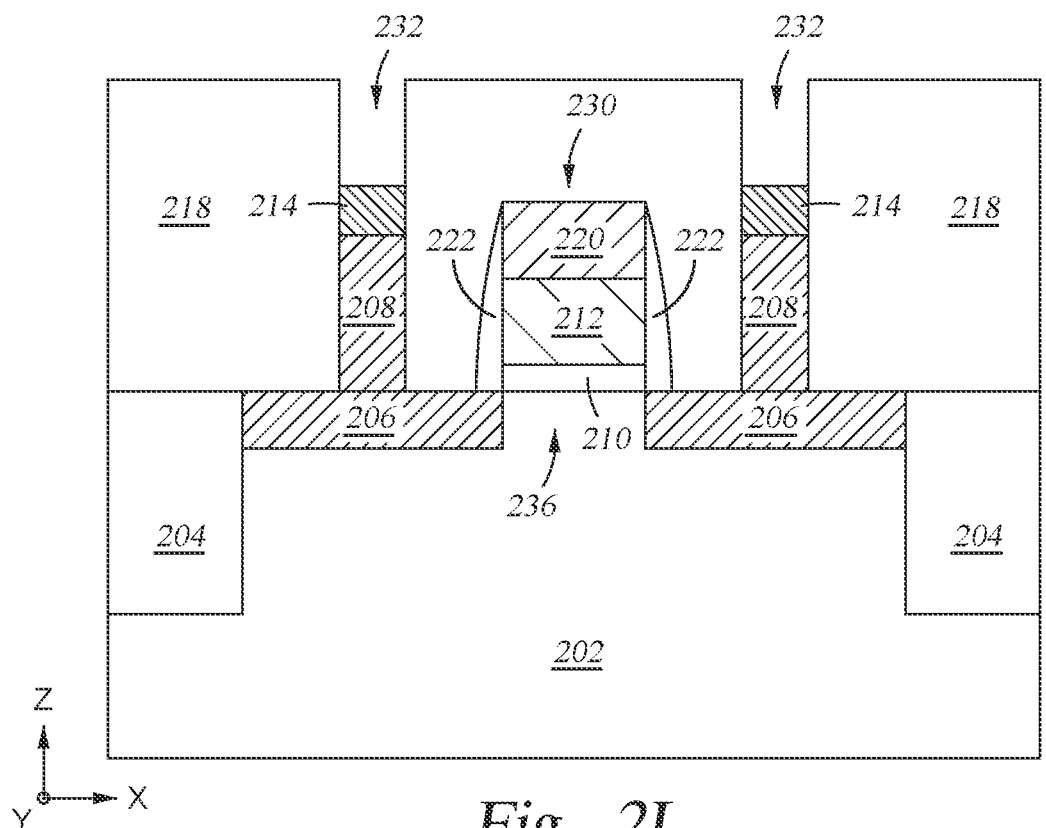

Referring to FIG. 2L, the top of the vertical portions 208 of the drift regions may be doped with n+ ions (e.g., phosphorous) by either implantation or plasma gas doping to form source and drain regions 214. In some cases, the dopant concentration of the source and drain regions 214 may range from $1\times10^{19}$ to $5\times10^{20}$ atoms/cm³. Accordingly, the source and drain regions 214 may be referred to as n+ regions. The source and drain regions 214 may have a thickness of 0.01 µm to 0.1 µm in the Z-direction. In some cases, the source and drain regions 214 may be formed by the growth of selectively doped silicon on top of the vertical portions 208 of the drift regions.

Figure 2M:
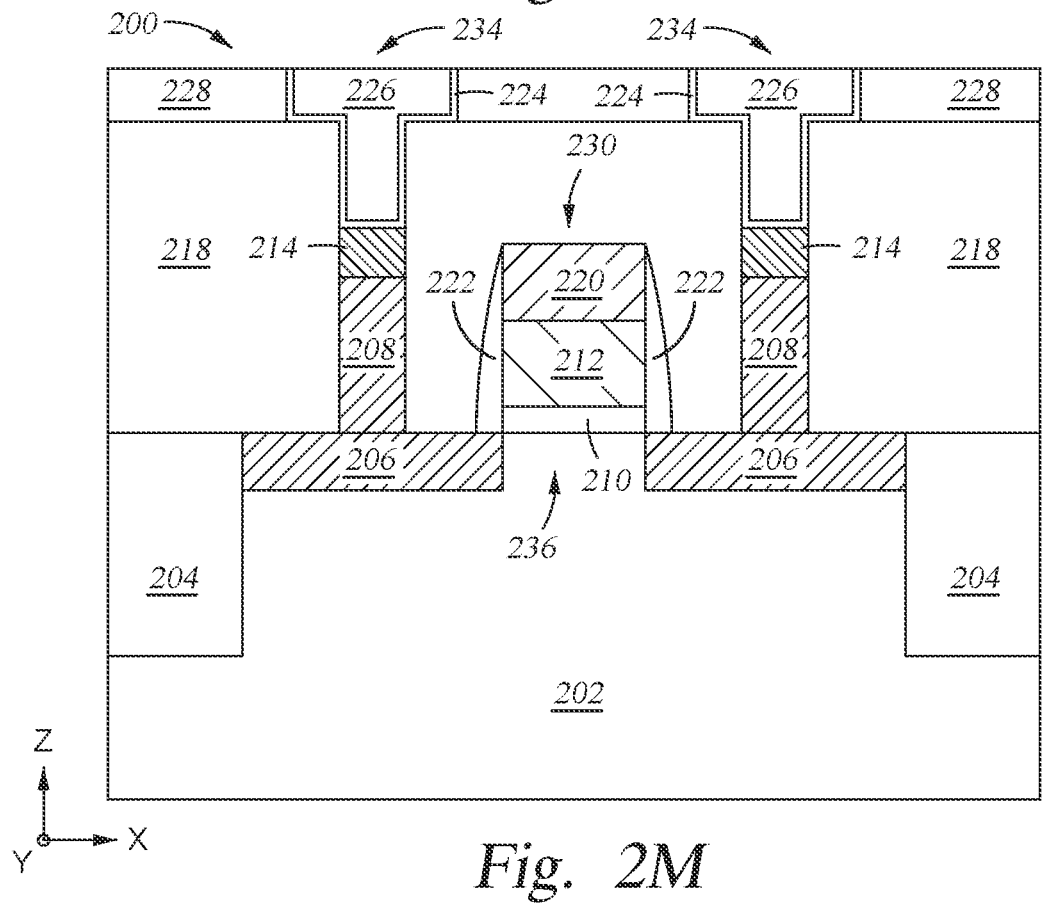

Referring to FIG. 2M, a second ILD layer 228, and a conductive pad 234 may be formed. The second ILD layer 228 may be a similar material as the first ILD layer 218 and may be deposited in the same or a similar manner. A recess may be formed through the first ILD layer 218 and the second ILD layer 228 using any appropriate photolithography and etching process. The conductive pad 234 may be deposited in the recess, such as by CVD, ALD, or physical vapor deposition (PVD). The conductive pad 234 can include a conformal barrier layer 224, such as titanium nitride (TiN), tantalum nitride (TaN), or the like, and a metal fill 226 on the barrier layer, such as tungsten (W), aluminum (Al), copper (Cu), or the like. The conductive pad 234 may form an ohmic contact with the respective source/drain region 214 that the conductive pad 234 contacts.

Additional processing steps, such as planarization, metallization, and the like, may be subsequently performed to complete fabrication of the device in which the transistor is formed.

Figure 3:
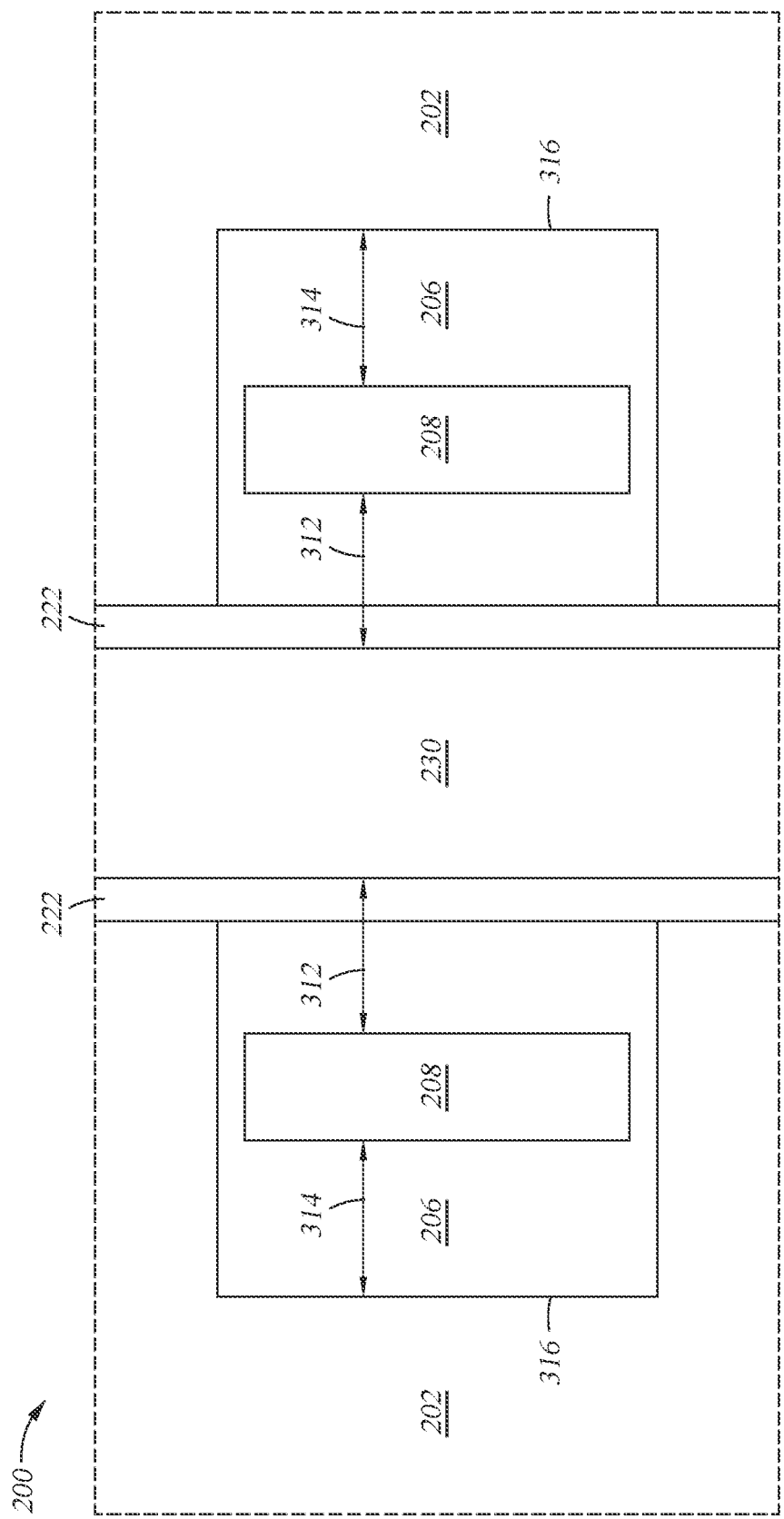
FIG. 3 depicts a top-down view of an example transistor structure, according to one or more of the embodiments described herein.

FIG. 3 depicts a top-down view of the transistor 200 of FIG. 2M, according to one or more of the embodiments described herein.

As shown, an edge of the vertical portions 208 of the drift regions may be spaced a distance 312 away from the semiconductor channel, which is disposed below the gate structure 230 of the transistor (e.g., the semiconductor channel 236 in FIG. 2E; or from an edge of the lateral portions 206 of the drift regions). Another edge of the vertical portions 208 of the drift regions may be spaced a distance 314 away from an edge 316 of the active region of the transistor 200 (or from another edge of the lateral portions 206 of the drift regions).

Some traditional transistors have source/drain regions disposed within the lateral portions 206 of the drift regions at the location where the vertical portions 208 of the drift regions are shown. Accordingly, the distance between the source/drain regions and the semiconductor channel of such a traditional transistor represents the entire length of each drift region, which may be approximately 0.6 µm.

Contrastingly, in transistor 200, each of the distances 312 and 314 may be less than 0.6 µm. The height $H_2$ of the vertical portions 208 of the drift regions provides additional spacing between the semiconductor channel and the source/drain regions. Accordingly, the distances 312 and 314 may be reduced by the height of the vertical portions 208 of the drift regions. For example, if the height $H_2$ of the vertical portions 208 of the drift regions is 0.5 µm, the distances 312 and 314 may each be 0.1 µm, as opposed to 0.6 µm. Accordingly, the width of the transistor 200 may be decreased by an amount equal to 4 times the height of the vertical portions 208 of the drift regions. The distances 312 and 314 need not be equal.

Figure 4:
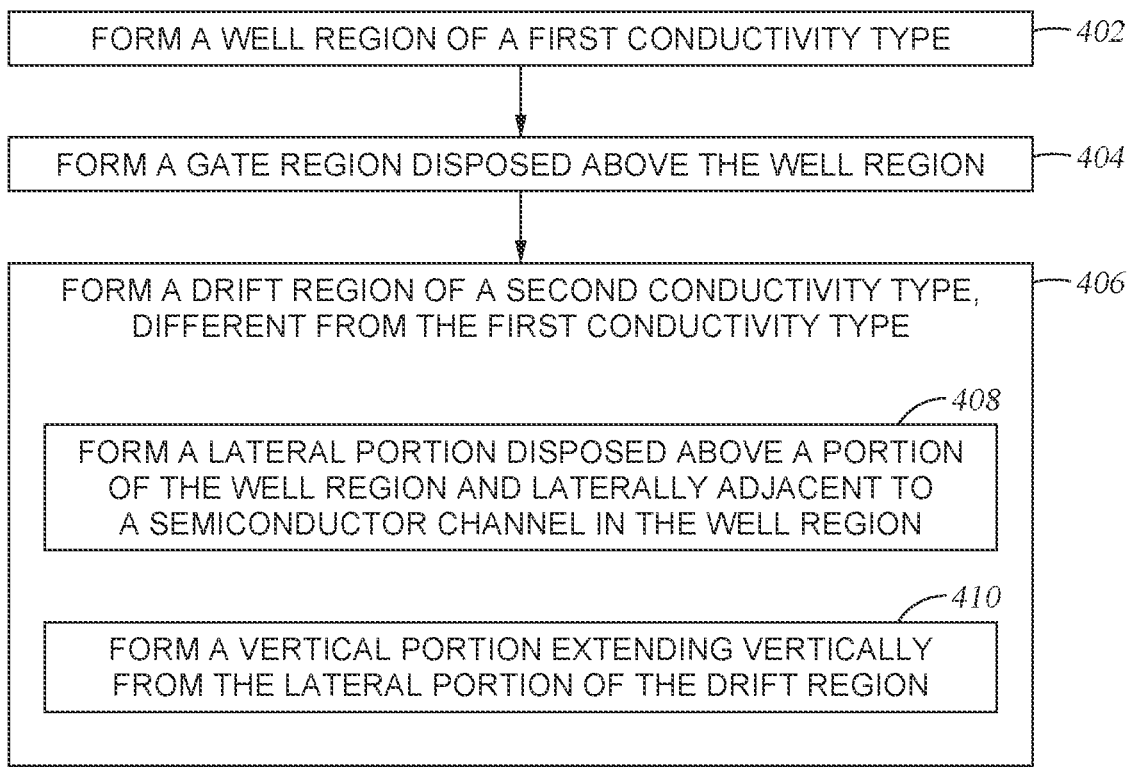
FIG. 4 depicts a process flow diagram that illustrates a plurality of activities that can be performed to form at least part of a high voltage transistor structure, according to one or more of the embodiments described herein.

FIG. 4 depicts a process flow diagram that illustrates a method 400 of forming at least part of a high voltage transistor structure, according to one or more of the embodiments described herein. Various different examples are described below. Although multiple features of different examples may be described together in a process flow, the multiple features can each be implemented separately or individually and/or in a different process flow. Additionally, various process flows are described as being performed in an order; other examples can implement process flows in different orders and/or with more or fewer operations. Additionally, although source and drain nodes and source and drain regions are described separately in various examples, such description can more generally be to a source/drain node or source/drain region.

The method 400 may begin, at 402, with forming a well region (e.g., well region 202) of a first conductivity type. At 404, the method 400 may involve forming a gate region (e.g., gate structure 230) disposed above the well region.

At 406, the method 400 may involve forming a drift region of a second conductivity type, different from the first conductivity type. Forming the drift region may involve, at 408, forming a lateral portion (e.g., lateral portion 206 of the drift region) disposed above a portion of the well region and laterally adjacent to a semiconductor channel in the well region. Forming the drift region may further involve, at 410, forming a vertical portion (e.g., vertical portion 208) extending vertically from the lateral portion of the drift region.

According to some examples, the method 400 may further involve forming a drain or a source region of the second conductivity type disposed above the vertical portion of the drift region. In some examples, the lateral portion of the drift region may extend laterally between the drain or the source region and the semiconductor channel.

According to some examples, forming the gate region may involve forming a gate oxide layer disposed above the well region, and forming a gate layer disposed above the gate oxide layer.

Figure 5:
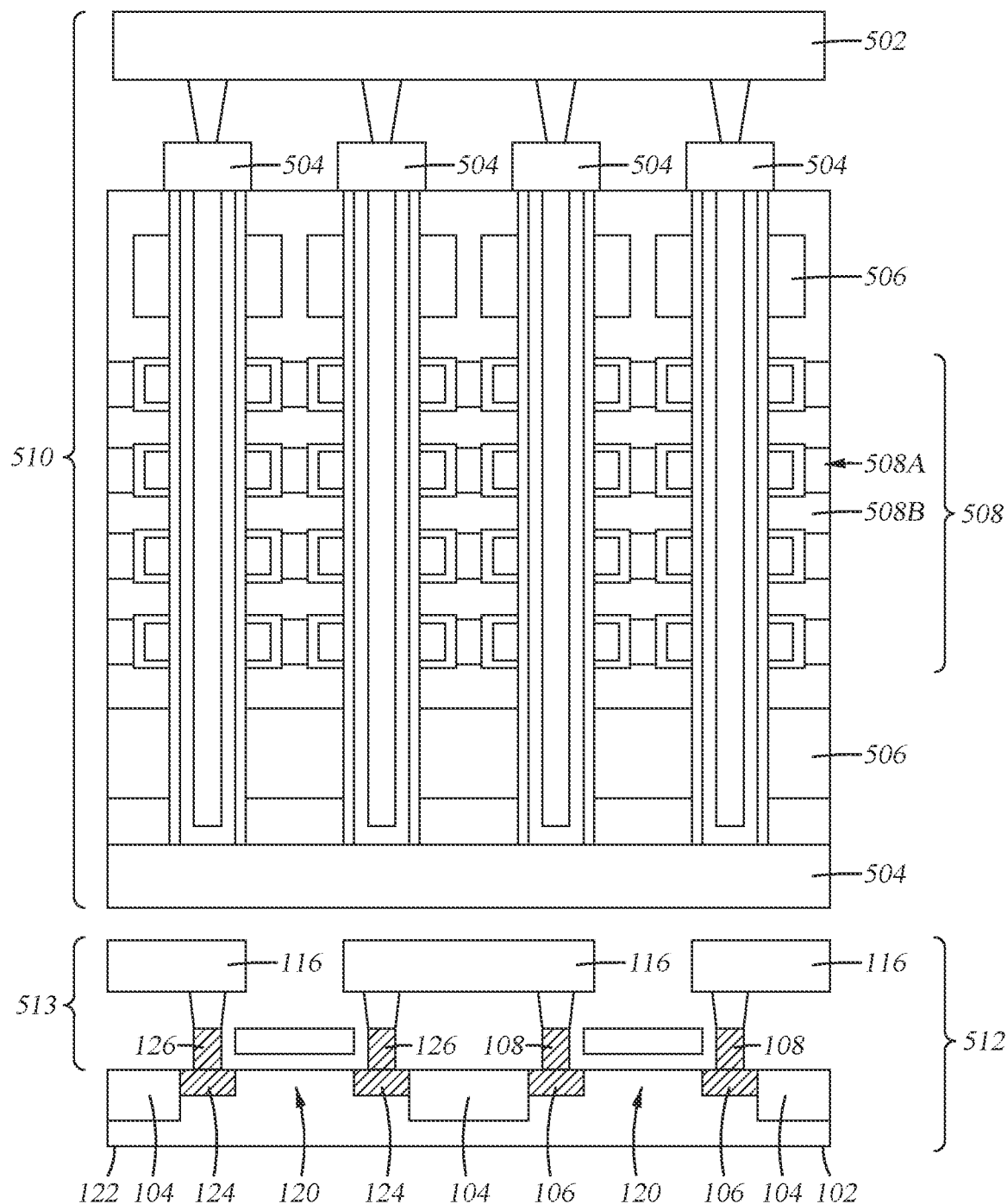
FIG. 5 is a simplified schematic example of a 3D NAND structure, in which embodiments of the present disclosure may be implemented.

FIG. 5 is a simplified schematic example of a three-dimensional (3D) NAND structure 500, in which embodiments of the present disclosure may be implemented. For example, the 3D NAND structure 500 may include a memory structure 510 and a transistor array 512 below the memory structure 510.

In one example, the memory structure 510 may include a bit line 502, source/drain regions 504, select gate regions 506, and a plurality of stacked layer pairs 508, which include word lines 508A and an interlayer dielectric layer 508B. The memory structure 510 may include a staircase (not shown) contact scheme for the word lines 508, which are found on opposing sides of the plurality of stacked layer pairs 508.

In certain aspects, the transistor array 512 may include an array of power transistors, such as power complimentary metal-oxide semiconductor (CMOS) transistors. One or more of the transistors in the transistor array 512 may include one or more features of the transistors 100A and/or 100B and may be formed according to the method 400 described with respect to FIG. 4. For example, as shown, the drift regions of the transistors in the transistor array 512 may include lateral portions 106, 124 and vertical portions 108, 126. Each of the conductive pads 116 of the transistor array 512 can be coupled to a word line 508A through a staircase contact (not shown) or to a bit line 502 as necessary to control the storage operations within a memory cell within the 3D NAND device. As shown, the vertical portions 108, 126 of the drift regions may utilize the vertical space 513 in an inter-layer dielectric (ILD) region of the 3D NAND structure 500.

While the foregoing is directed to embodiments of the present disclosure, other and further embodiments of the disclosure may be devised without departing from the basic scope thereof, and the scope thereof is determined by the claims that follow.

What is claimed is:

1. A transistor comprising:
   a well region of a first conductivity type;
   a gate region disposed above the well region in a first direction;
   a drain region or a source region of a second conductivity type, different from the first conductivity type; and
   a drift region of the second conductivity type, comprising:
      a lateral portion disposed above a portion of the well region in the first direction, and laterally adjacent to a semiconductor channel in the well region in a second direction perpendicular to the first direction; and a vertical portion extending vertically from the lateral portion of the drift region to the drain region or to the source region in the first direction.

2. The transistor of claim 1, wherein the vertical portion of the drift region comprises a graded doping profile which increases as a distance from the well region increases.

3. The transistor of claim 2, wherein the graded doping profile is graded from a first doping concentration (C1) to a second doping concentration (C2), C2 being 1.1 to 100 times greater than C1.

4. The transistor of claim 1, wherein:
the lateral portion of the drift region is disposed between the vertical portion and the semiconductor channel.

5. The transistor of claim 1, wherein:
the gate region comprises:
a gate oxide layer disposed above the well region, and
a gate layer disposed above the gate oxide layer; and
a top of the vertical portion of the drift region is above a top of the gate layer.

6. The transistor of claim 1, wherein:
the gate region comprises:
a gate oxide layer disposed above the well region, and
a gate layer disposed above the gate oxide layer; and
a top of the vertical portion of the drift region is above a top of the gate oxide layer.

7. The transistor of claim 1, wherein a length of the vertical portion of the drift region is directly proportional to a breakdown voltage of the transistor.

8. The transistor of claim 1, wherein a length of the vertical portion of the drift region is between 0.1 µm and 0.6 µm.

9. The transistor of claim 1, wherein:
the vertical portion of the drift region has a first length that extends in the first direction between a surface of the lateral portion and the drain region, or extends in the first direction between the surface of the lateral portion and the source region,
the lateral portion of the drift region has a second length that extends in the second direction between an edge of the semiconductor channel and an edge of the vertical portion of the drift region, and
the sum of the first length and the second length are configured to achieve a breakdown voltage of the transistor of at least 30 V.

10. A three-dimensional NAND flash memory integrated circuit, comprising a plurality of transistors including the transistor of claim 1.

* * * * *